United States Patent
Thumser

(10) Patent No.: US 8,995,113 B2
(45) Date of Patent: Mar. 31, 2015

(54) METHOD AND SYSTEM FOR CONNECTING A PLURALITY OF PRINTED CIRCUIT BOARDS TO AT LEAST ONE FRAME OR CARRIER ELEMENT AND PRINTED CIRCUIT BOARD AND FRAME OR CARRIER ELEMENT

(75) Inventor: Christoph Thumser, Graz (AT)

(73) Assignee: AT & S Austria Technologie & Systemtechnik Aktiengesellschaft, Leoben-Hinterberg (AT)

(*) Notice: Subject to any disclaimer, the term of this patent is extended or adjusted under 35 U.S.C. 154(b) by 513 days.

(21) Appl. No.: 13/255,155

(22) PCT Filed: Mar. 5, 2010

(86) PCT No.: PCT/AT2010/000067
§ 371 (c)(1),
(2), (4) Date: Sep. 7, 2011

(87) PCT Pub. No.: WO2010/102315
PCT Pub. Date: Sep. 16, 2010

(65) Prior Publication Data
US 2011/0315433 A1   Dec. 29, 2011

(30) Foreign Application Priority Data

Mar. 9, 2009   (AT) ................. GM133/2009

(51) Int. Cl.
*H02B 1/00* (2006.01)
*H05K 13/00* (2006.01)
*H05K 3/00* (2006.01)

(52) U.S. Cl.
CPC .......... *H05K 13/0061* (2013.01); *H05K 3/0097* (2013.01); *H05K 2201/10598* (2013.01); *H05K 2203/0169* (2013.01)

USPC ......................................... 361/600

(58) Field of Classification Search
USPC .................. 361/600, 679.01, 813; 174/255; 29/592.1
See application file for complete search history.

(56) References Cited

U.S. PATENT DOCUMENTS

| 4,689,103 A | 8/1987 | Elarde |
| 5,044,615 A | 9/1991 | Newman |

(Continued)

FOREIGN PATENT DOCUMENTS

| CN | 1430866 A | 7/2003 |
| DE | 19600928 | 7/1997 |

(Continued)

*Primary Examiner* — Bernard Rojas
(74) *Attorney, Agent, or Firm* — Jacobson Holman, PLLC.

(57) ABSTRACT

In a method and a system for connecting a plurality of printed circuit boards (1) to at least one frame or carrier element (5), the following elements are provided:
a plurality of printed circuit boards (1), which are designed to have at least one coupling element (4) on at least one edge (2, 3),
at least one frame or carrier element (5) for coupling to a plurality of printed circuit boards (1) using coupling elements (6) that in each case complement at least one coupling element (4) of the printed circuit boards (1), wherein the printed circuit boards (1) can be coupled to the at least one frame or carrier element (5) by fitting the coupling elements (4, 6) of the printed circuit boards (1) and of the frame or carrier element (5), and wherein the at least one frame or carrier element (5) only surrounds or encloses the printed circuit boards (1) over a partial region of the circumference. In addition, a printed circuit board (1) and a frame or carrier element (5) for use in such a method and system are provided.

3 Claims, 3 Drawing Sheets

(56) References Cited

U.S. PATENT DOCUMENTS

| | | |
|---|---|---|
| 5,866,852 A | 2/1999 | Benz |
| 6,338,194 B1 * | 1/2002 | Benz et al. ................ 29/830 |
| 7,874,861 B2 * | 1/2011 | Wang ........................ 439/325 |
| 2003/0178725 A1 | 9/2003 | Yanase et al. |
| 2010/0115766 A1 * | 5/2010 | Hasegawa ................ 29/830 |

FOREIGN PATENT DOCUMENTS

| | | |
|---|---|---|
| DE | 10155829 | 7/2002 |
| EP | 1313357 A1 | 5/2003 |
| EP | 2223580 | 9/2010 |
| JP | 2005-38953 A | 2/2005 |
| WO | 2009/068741 A1 | 6/2009 |

* cited by examiner

METHOD AND SYSTEM FOR CONNECTING A PLURALITY OF PRINTED CIRCUIT BOARDS TO AT LEAST ONE FRAME OR CARRIER ELEMENT AND PRINTED CIRCUIT BOARD AND FRAME OR CARRIER ELEMENT

This is a national stage of PCT/AT2010/000067, filed Mar. 5, 2010 and published in German, which has a priority of Austria no. GM 133/2009, filed Mar. 9, 2009, hereby incorporated by reference.

FIELD OF THE INVENTION

The present invention relates to a method for connecting a plurality of printed circuit boards to at least one frame or carrier element, comprising the steps of
  providing a plurality of printed circuit boards which are each designed to have at least one coupling element on at least one edge,
  providing at least one frame or carrier element for coupling to a plurality of printed circuit boards using coupling elements that in each case complement the at least one coupling element of the printed circuit boards, and
  coupling or connecting the printed circuit boards to the at least one frame or carrier element by fitting together the coupling elements of the printed circuit boards and the frame or carrier element.

The invention, moreover, relates to a system for connecting a plurality of printed circuit boards to a frame or carrier element, comprising the following elements:
  a plurality of printed circuit boards which are each designed to have at least one coupling element on at least one edge, and
  at least one frame or carrier element for coupling to a plurality of printed circuit boards using coupling elements that in each case complement the at least one coupling element of the printed circuit boards,
  wherein the printed circuit boards can be coupled to the at least one frame or carrier element by fitting together the coupling elements of the printed circuit boards and the frame or carrier element.

The invention is further related to a printed circuit board and a frame or carrier element for use in such a method and system.

PRIOR ART

In the context of the production of printed circuit boards it is known to produce a plurality of printed circuit boards or circuit board elements on a common, plate-shaped element, such printed circuit boards being usually each comprised of a plurality of conducting or insulating layers and/or components integrated in such a printed circuit board. According to such known production methods, a substantially full-surface arrangement of a plurality of printed circuit boards on the common, plate-shaped-shaped element is effected, whereupon, after the completion of the printed circuit boards, the latter are separated from one another. In those cases, each of the printed circuit boards has a respective edge region about its periphery, and hence outside a substantially central region forming an actual printed circuit board element, in which the structures for the formation of the printed circuit board and/or the electronic component are integrated. The edge region is provided for performing further processing steps of such a printed circuit board, for instance in the context of the insertion of components to be fixed to at least one surface and/or the installation into an electric or electronic device, in order to enable the handling and, in particular, the automatic seizure of such a printed circuit board during subsequent treatment or processing steps. According to presently known process controls, it is thus to be anticipated that the peripheral region to be provided for the frame or the peripheral region of the printed circuit board is likewise produced of a usually expensive material in accordance with the usually multilayered printed circuit board. Such an edge or peripheral region, which is not required for the functioning of the printed circuit board, will however, result in elevated costs of such a printed circuit board, considering the usually multilayer structure made of expensive materials. In addition, it is to be anticipated that in the context of known production methods of printed circuit boards, regions or surfaces located between individual printed circuit board elements, of the common plate-shaped element are discarded as waste such that elevated costs for the production of printed circuit boards or printed circuit board elements will also occur in this respect.

In connection with the production of printed circuit boards it is, moreover, known to remove individual defective printed circuit boards from a common plate-shaped element if they are recognized as defective in the course of tests or checks, and to insert individual printed circuit boards in place of such removed, defective printed circuit boards.

In addition, methods and systems of the initially defined kind for collectively processing and handling printed circuit boards are known, according to which several printed circuit boards or printed circuit board elements are usually each inserted into frame elements surrounding the printed circuit boards about their entire peripheries, and fixed to them, for instance, by gluing. In this respect, it can, for instance, be referred to DE-A 196 00 928, DE-A 101 55 829, U.S. Pat. No. 4,689,103 or U.S. Pat. No. 5,044,615. Those known methods for inserting printed circuit boards into a frame element each completely surrounding the printed circuit boards, in particular, involve the drawbacks that the reception openings to be provided in the frame element for the arrangement of the printed circuit boards have to be precisely adapted to the dimensions of the printed circuit boards to be inserted, and a proper fixation, for instance by gluing, on the peripheral edges of the printed circuit boards and frame elements usually having comparatively small thicknesses are thus extremely difficult and complex.

SUMMARY OF THE INVENTION

The present invention, therefore, aims to further develop a method and a system for connecting a plurality of printed circuit boards to at least one frame or carrier element to the effect that a simple and reliable connection between such printed circuit boards and at least one frame or carrier element will be provided for subsequent processing steps. Such a simple connection, moreover, is to reduce and/or optimize the costs for the production of printed circuit boards in additional treatment or processing steps, wherein, in addition, a material that is more cost-effective and simpler to produce than the material used for the, particularly multilayer, circuit board is to suffice for the at least one frame or carrier element.

To solve these objects, a method for connecting a plurality of printed circuit boards to at least one frame or carrier element is essentially characterized in that the at least one frame or carrier element only surrounds or encloses the printed circuit boards over a partial region of the periphery or circumference.

By the method according to the invention, it has thus become possible to provide a plurality of printed circuit boards by appropriately utilizing the usually expensive material employed for the particularly multilayer printed circuit board, wherein frame or carrier elements required for further processing steps and calling for additional material expenses can be renounced during the production of the individual printed circuit boards. For the simple coupling or connection to at least one frame or carrier element, a coupling element that is simple to produce is each provided or formed on at least one edge or side edge of each printed circuit board. It is, moreover, proposed to provide the at least one frame or carrier element with coupling elements that in each case complement the at least one coupling element of the printed circuit boards, wherein such a frame or carrier element can, in particular, be produced of a material that is more cost-effective and optionally simpler than the material of the printed circuit board such that the material costs for the production of individual printed circuit boards will altogether be reduced. By providing at least one coupling element on at least one respective edge of the individual printed circuit boards as well as coupling elements on the at least one frame or carrier element, the simple connection or coupling of the printed circuit board to the at least one frame or carrier element has become feasible. In particular in order to further save material, it is, moreover, provided according to the invention that the at least one frame or carrier element only surrounds or encloses the printed circuit boards over a partial region of the periphery. Such merely partial enclosure or surrounding will do for further treatment or processing steps of the printed circuit boards and, in addition, will provide further simplification in the production of printed circuit boards relative to the known prior art, where an enclosure of the individual printed circuit boards by a frame or carrier element over the entire periphery at accordingly elevated costs has usually been provided for connecting or coupling.

Such a further treatment or processing of the printed circuit boards can, for instance, take place on at least one surface of the printed circuit boards connected with the at least one frame or carrier element in the context of the attachment of additional components. The seizure of the frame or carrier element arranged or fixed on the periphery of the printed circuit boards will, moreover, also enable the insertion of a printed circuit board in an electric or electronic device. Depending on the purpose of use, the frame or carrier element can again be separated from the printed circuit board after completion of the processing of the printed circuit board, for instance for the insertion of the printed circuit board into an electric or electronic device. In addition to the option of the frame or carrier element remaining on the printed circuit board during its insertion into an electric or electronic device, a separation of at least partial regions of the provided frame or carrier element as a function of the purpose of use and/or as a function of the space available for the insertion of the printed circuit board may alternatively be provided.

For the proper and simple connection of the printed circuit boards with the at least one frame or carrier element, it is proposed according to a preferred embodiment of the method according to the invention that the respective at least one coupling element of the printed circuit boards and the complementary coupling elements of the frame or carrier element are positively connected.

To further improve or ensure the connection between the plurality of printed circuit boards and the at least one frame or carrier element, it is proposed according to a further preferred method that the at least one coupling element of the printed circuit boards is glued with the complementary coupling elements of the frame or carrier element. Particularly as a function of the further treatment or processing steps, adhesives usually used in the context of the production of a printed circuit board are provided, UV-curing adhesives being, for instance, usable in a particularly favourable and rapid and reliable manner.

To provide a coupling or connection that is simple to establish and reliable, between the individual printed circuit boards and the at least one frame or carrier element, it is, moreover, proposed that the at least one coupling element of the printed circuit boards is formed by a profiled coupling element projecting from an edge of the printed circuit board and received in a complementary recess or depression of the frame or carrier element, as in correspondence with a further preferred embodiment of the method according to the invention.

In this context, it is proposed according to a further preferred embodiment that the at least one coupling element of the printed circuit board is formed by a coupling element having a tapering cross section and, in particular, a triangular cross section. Such a tapering cross section and, in particular, triangular cross section for a coupling element allows for the simple and reliable fitting together or fitting in of the coupling element of the printed circuit board in the complementary coupling element in the form of a recess or depression of the frame or carrier element. The tapering shape and, in particular, a triangular cross section allows for the simple, automatic centering of the printed circuit board relative to the frame or carrier element and the position of fixation, respectively.

For an accordingly simple and reliable handling of the individual printed circuit boards during subsequent treatment or processing steps, it is, moreover, proposed according to a further preferred embodiment that a plurality of printed circuit boards are connected to the at least one frame or carrier element in a mutually spaced-apart relationship. Such a distance between the individual printed circuit boards fixed to, or arranged on, the at least one frame or carrier element can, in particular, be realized as a function of further treatment or processing steps.

In order to avoid in particular unilateral loads on the individual printed circuit boards and enable a uniform retention of the individual printed circuit boards during subsequent individual method steps, it is, moreover, proposed that the printed circuit boards, on two oppositely located edges, are each designed to have at least one coupling element, which cooperate with frame or carrier elements provided on the oppositely located edges of the printed circuit boards, as in correspondence with a further preferred embodiment of the method according to the invention. The individual printed circuit boards on two oppositely located edges or sides can thus each be connected or coupled to a frame or carrier element in a manner that the adjacently arranged and preferably mutually spaced-apart printed circuit boards are each retained on the two sides or ends of the printed circuit boards via the provided frame or carrier elements in order to be, for instance, handled or seized.

For the particularly automatic connection or coupling of the plurality of printed circuit boards to the at least one frame or carrier element, it is proposed according to a further preferred embodiment of the method according to the invention that a plurality of mutually spaced-apart circuit boards on a conveying element are brought into mutual positions provided for a connection to the at least one frame or carrier element, that the at least one frame or carrier element is moved in a supply direction substantially normal to the supply direction of the printed circuit boards towards the printed circuit board edges provided with the coupling elements, and that the coupling elements of the printed circuit boards are coupled or connected to the coupling elements of the frame or carrier element. It has thus become possible according to the invention to substantially fully automate the connection procedure between the printed circuit boards and the at least one frame or carrier element so as to again further lower the costs for the production of individual printed circuit boards by a simplified method, which is also accelerated by such automation.

When providing a coupling of the individual printed circuit boards on two oppositely located edges or sides each with at least one frame or carrier element, as has been discussed above for a preferred embodiment of the method according to the invention, it is likewise preferably proposed according to the invention for an automated coupling or connection that, after having positioned a plurality of printed circuit boards in a position provided for coupling, two frame or carrier elements are moved in mutually opposite directions towards the printed circuit boards provided with the coupling elements and are connected with the same.

To further support the correct connection or coupling between the printed circuit boards and the at least one frame or carrier element, particularly in the context of an automated connection, it is proposed according to a further preferred embodiment that the printed circuit boards and/or the frame or carrier elements during coupling are positioned and held together by holding or clamping elements.

To achieve the initially mentioned objects, a system for connecting a plurality of printed circuit boards to at least one frame or carrier element of the initially defined kind is, moreover, essentially characterized in that the at least one frame or carrier element only surrounds or encloses the printed circuit boards over a partial region of the periphery.

As already pointed out above, a particularly cost-effective production of a plurality of printed circuit boards and of the respective at least one frame or carrier element has thus become possible, enabling the subsequent connection of the same in a simple and reliable manner.

In respect to the provision of coupling elements that are simple to produce and reliable, it is preferably proposed according to the invention that the respective at least one coupling element of the printed circuit boards is formed by a profiled coupling element projecting from an edge of the printed circuit board and receivable in a complementary recess or depression of the frame or carrier element.

In order to provide for simple and reliable handling during coupling as well as substantially automatic centering during a connection between a printed circuit board each and the at least one frame or carrier element, it is moreover proposed in a preferred manner that the at least one coupling element of the printed circuit board is formed by a coupling element having a tapering cross section and, in particular, a triangular cross section.

In order to provide for simple and reliable coupling as well as substantially automatic centering during a connection between a printed circuit board each and the at least one frame or carrier element, it is moreover proposed that the at least one coupling element of the printed circuit board is formed by a coupling element having a tapering cross section and, in particular, a triangular cross section, as in correspondence with a preferred further embodiment of the system according to the invention.

For a particularly simple production of the coupling elements of the frame or carrier element it is proposed according to a further preferred embodiment that the coupling elements of the frame or carrier element are each formed by a partial region offset from the surface of the frame or carrier element, in which a coupling element of a printed circuit board can each be fitted.

According to an alternative preferred embodiment, it is proposed according to the invention, in order to enable a simple production of the coupling elements of the frame or carrier element, that the coupling elements of the frame or carrier element are comprised of cavities or depressions formed on a side edge oriented to the printed circuit boards.

As already pointed out above, further improvement in the handleability and the balancing out of forces possibly acting on the printed circuit board during its production will preferably be provided if the printed circuit boards, on two oppositely located edges, are each designed to have at least one coupling element, which cooperate with frame or carrier elements provided on the oppositely located edges of the printed circuit boards.

To achieve the initially mentioned objects, a printed circuit board for use in a method according to the invention, or a preferred embodiment thereof, and in a system according to the invention, or a preferred embodiment thereof, is provided, which is essentially characterized in that it is designed to have at least one coupling element on at least one edge for coupling to a frame or carrier element. It is thus feasible to provide a printed circuit board that is easy to produce and can be easily connected with at least one frame or carrier element.

For coupling a printed circuit board according to the invention with a frame or carrier element each on two oppositely located sides, it is proposed according to a further preferred embodiment that the printed circuit board, on two oppositely located edges, is each designed to have at least one coupling element, which cooperate with frame or carrier elements provided on the oppositely located edges of the printed circuit boards.

In order to enable particularly simple and reliable centering of a printed circuit board relative to the at least one frame or carrier element to be coupled or connected thereto, it is proposed according to a further preferred embodiment that the at least one coupling element of the printed circuit board is formed by a coupling element having a tapering cross section and, in particular, a triangular cross section.

To solve the initially mentioned objects, a frame or carrier element for use in a method according to the invention, or a preferred embodiment thereof, and in a system according to the invention, or a preferred embodiment thereof, is moreover provided, which is essentially characterized in that the frame or carrier element is provided with a plurality of coupling elements that complement coupling elements of printed circuit boards connectable therewith. As already pointed out above, a frame or carrier element comprising complementary coupling elements required for a coupling or connection to a plurality of printed circuit boards can thus be provided in a simple and reliable manner.

For the reliable coupling of a plurality of printed circuit boards, it is proposed according to a preferred embodiment that the coupling elements of the frame or carrier element are each formed by a partial region offset from the surface of the frame or carrier element, in which a coupling element of a printed circuit board can each be fitted.

For a reliable connection to a plurality of printed circuit boards, it is alternatively proposed in a preferred manner that the coupling elements of the frame or carrier element are comprised of cavities or depressions formed on a side edge oriented to the printed circuit boards.

Partial regions offset in this manner, and cavities or depressions, which are used as coupling elements of the frame or carrier element can be provided by removing individual layers or plies of a multilayer frame or carrier element. If suitable materials or layers which, during the production of multilayer frame or carrier elements, prevent the adhesion between individual partial regions subsequently forming cavities or depressions are used to remove such partial regions, such an adhesion-preventing material can subsequently be used when also applying suitable method steps, in order to support or provide coupling to the coupling elements of the individual printed circuit boards such that, for instance, the use of an additional adhesive can be renounced.

As already mentioned above, such a frame or carrier element can, in particular, be produced of a material that is more cost-effective than the material used for the printed circuit boards. In doing so, it is proposed according to a further preferred embodiment of the frame or carrier element according to the invention that the frame or carrier element is designed to be reusable. Such a reusability or recyclability of frame or carrier elements will further reduce the costs for the production of such printed circuit boards or circuit board elements, since the costs already reduced relative to known methods, of the frame or carrier elements to be provided, due to their multiple use, can be distributed to an accordingly increased number of printed circuit boards to be produced.

SHORT DESCRIPTION OF THE INVENTION

In the following, the invention will be explained in more detail by way of exemplary embodiments schematically illustrated in the accompanying drawing. Therein:

Figure 1:
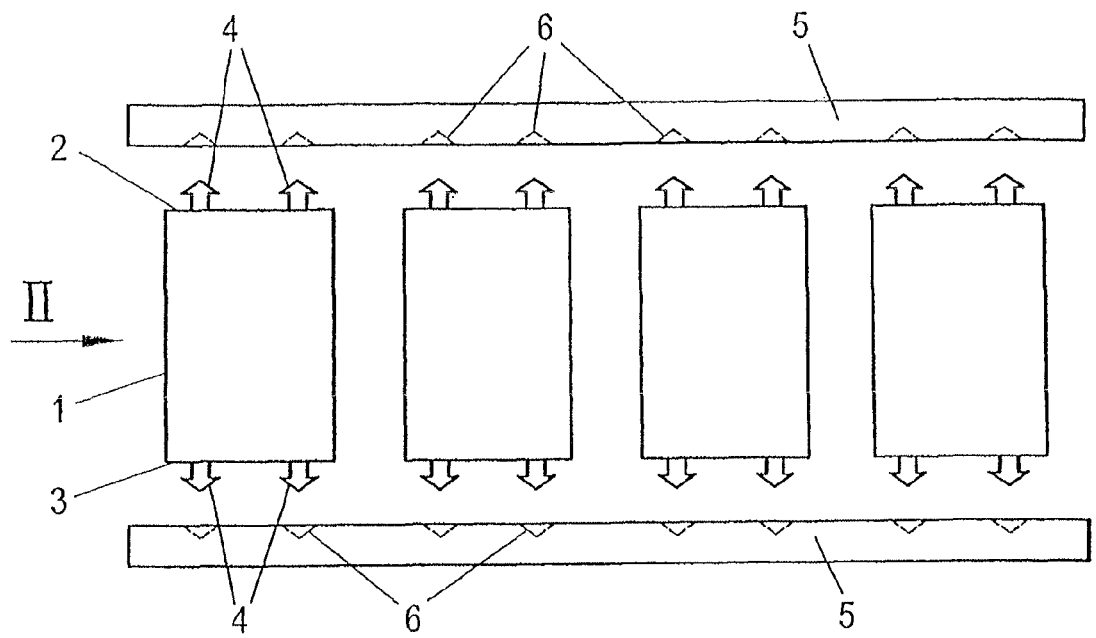
FIG. 1 is a schematic top view on a plurality of printed circuit boards that are each connectable, on oppositely located edges or sides, to a common frame or carrier element according to the method and system of the present invention, in a state prior to connecting or coupling between the printed circuit boards and the frame or carrier elements.
Figure 5:
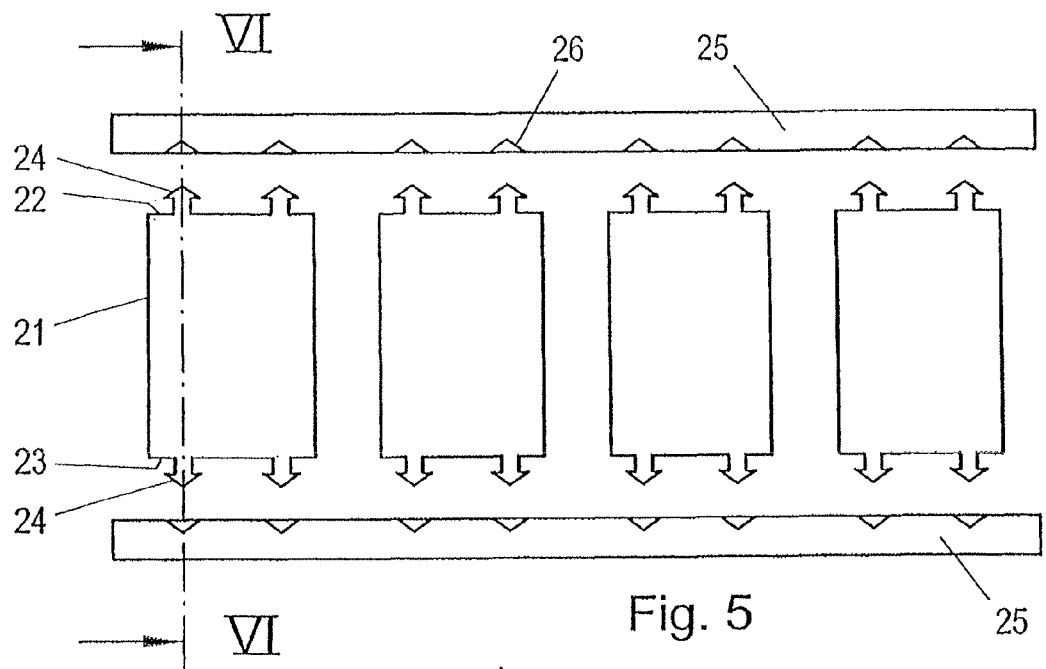
Figure 6:
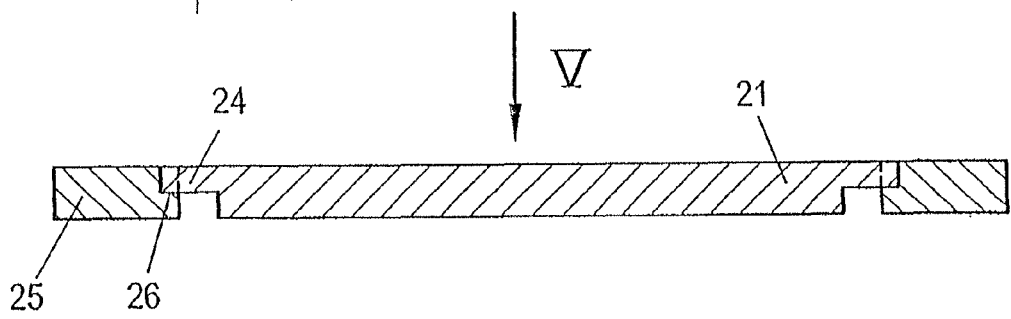
Figure 7:
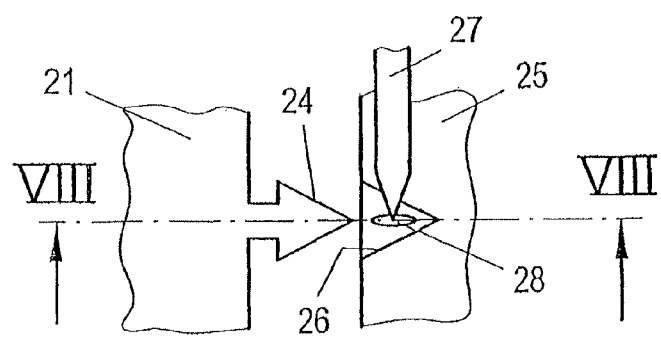
Figure 8:
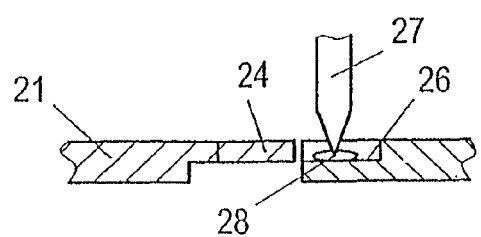

FIG. 5, in an illustration similar to that of FIG. 1, depicts a schematic top view on a modified embodiment of a plurality of printed circuit boards and frame or carrier elements to be connected thereto for use in a method and system according to the invention, in a state prior to connecting the printed circuit boards with the frame or carrier elements;

FIG. 6 represents a section along line VI-VI of FIG. 5 on an enlarged scale, FIG. 5 depicting a view along arrow V of FIG. 6;

FIG. 7, on an enlarged scale, illustrates a detail in a top view on a coupling element of a printed circuit board and the frame or carrier element to be connected thereto, the application of adhesive being moreover indicated; and FIG. 8 is a sectional view along line VIII-VIII of FIG. 7.

DETAILED DESCRIPTION OF PREFERRED EMBODIMENTS

FIG. 1 schematically depicts a plurality of printed circuit boards 1, for instance, produced in the form of multilayer circuit boards in preceding method steps known per se, the printed circuit boards 1 in the embodiment illustrated in FIG. 1 being each designed to have two coupling elements 4 on oppositely located side edges 2 and 3.

In the configuration according to FIG. 1, the coupling elements 4 are each formed with a tapering cross section and, in particular, a triangular cross section in top view.

In addition, it is provided according to FIG. 1 that a frame or carrier element 5 is each provided facing the respective edges 2 and 3 of the printed circuit boards 1, which frame or carrier element is designed to have coupling elements in the form of cavities or depressions 6 corresponding to, or complementing, the coupling elements 4 of the printed circuit boards 1.

Figure 2:
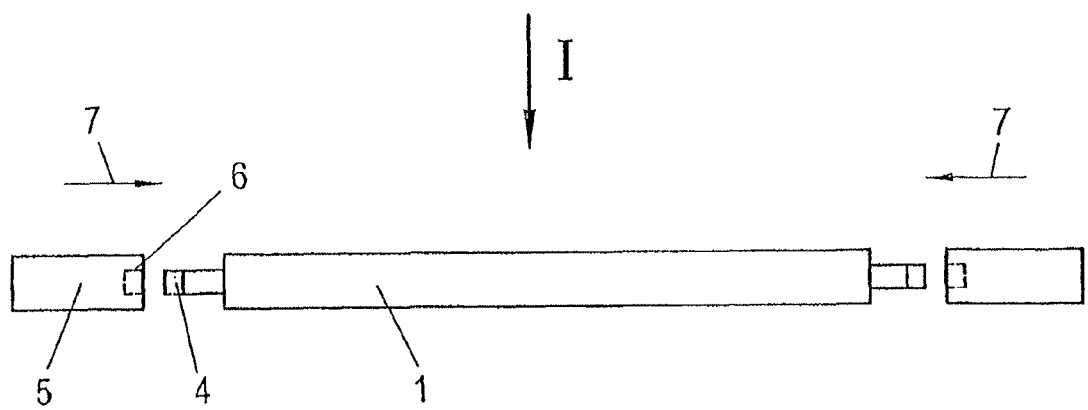
FIG. 2 is a schematic side view along arrow II of FIG. 1 on an enlarged scale, FIG. 1 illustrating a view along arrow I of FIG. 2.

To connect or couple the printed circuit boards 1 to the frame or carrier elements 5, the frame or carrier elements 5 are moved in a direction to the printed circuit boards 1, as is schematically indicated by arrow 7 in FIG. 2, thus causing the coupling elements 4 of the printed circuit boards 1 to enter the cavities or depressions forming the coupling elements 6 of the frame or carrier elements 5 so as to achieve a connection or coupling between the frame or carrier elements 5 and the printed circuit boards 1.

As is apparent from FIGS. 1 and 2, the frame or carrier elements 5 only surround the individual printed circuit boards 1 over a partial region of their peripheries or circumferences, the printed circuit boards 1 being moreover located on the frame or carrier elements 5 in a mutually spaced-apart relationship.

Such connection between the individual frame or carrier elements 5 and the plurality of printed circuit boards 1 is followed by further treatment or processing steps on the individual printed circuit boards 1, e.g. the population thereof.

The configuration of the coupling elements 5 in the form of triangles or with tapering cross sections enables the simple and reliable centering of the printed circuit boards relative to the coupling elements 6 of the frame or carrier elements 5.

By positively fitting together the coupling elements 4 and 6 of the printed circuit boards 1 and the frame or carrier elements 5, respectively, a reliable connection between the individual elements and fixation thereof will be achieved.

If the cavities or depressions 6 of the frame or carrier elements are produced by removing partial regions after the provision or application of an adhesion-preventing material, it will be ensured, by suitable treatment or processing steps in the context of the coupling or connection of the printed circuit boards 1 and the frame or carrier elements 5, that a connection in the region of the coupling elements 4 and 6 will, in particular, be feasible without providing any additional adherence.

Figure 3:
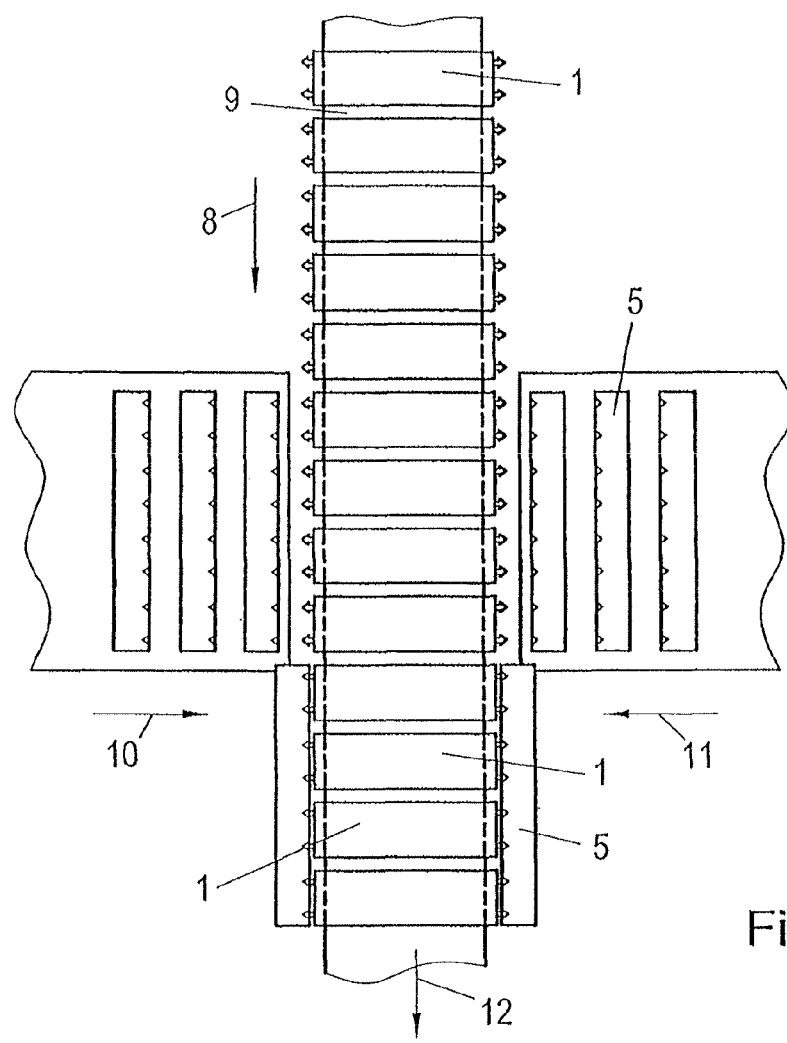
FIG. 3 is a schematic top view on an automated method according to the invention for connecting a plurality of printed circuit boards each with at least one frame or carrier element.
Figure 4:
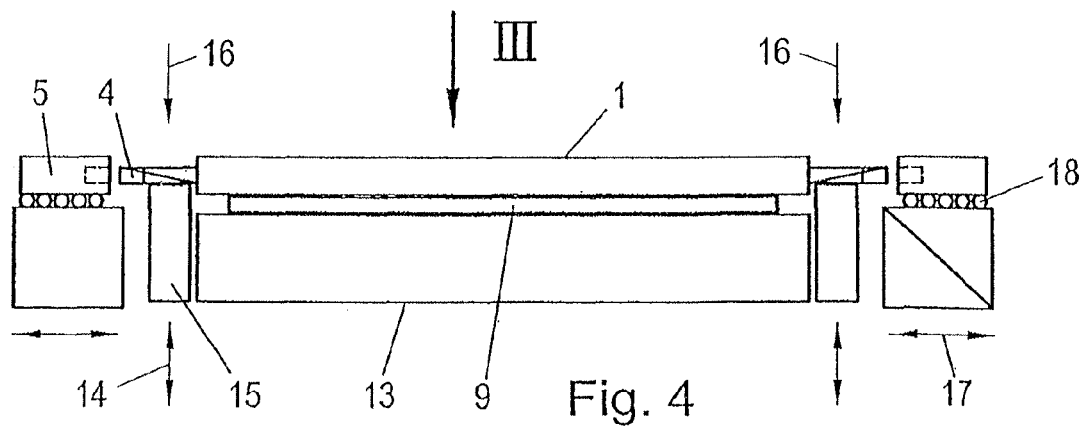
FIG. 4 is a schematic sectional or side view of the embodiment illustrated in FIG. 3 on an enlarged scale, FIG. 3 depicting a view along arrow III of FIG. 4.

FIGS. 3 and 4 schematically illustrate the automated connection or coupling between printed circuit boards again denotes by 1 and frame or carrier elements denoted by 5.

In this case, individual printed circuit board elements or circuit boards 1 are supplied in the sense of arrow 8 on a conveying element schematically indicated by 9.

When reaching the centrally illustrated position of the respective number of printed circuit boards 1, and by again providing two frame or carrier elements 5 on oppositely located edges or side edges of the printed circuit boards 1 and moving the same in the sense of arrows 10 and 11, substantially automated coupling between the printed circuit boards 1 and the frame or carrier elements 5 to be connected therewith takes place.

After coupling of the printed circuit boards 1 to the frame or carrier elements 5 as illustrated in the lower region of FIG. 3, the removal of the system comprised of a plurality of printed circuit boards 1 and at least one frame or carrier element 5 is effected in the sense of arrow 12.

FIG. 4, on an enlarged scale, depicts a table or support 13 on which the printed circuit boards 1 are each supplied via the conveyor belt 9.

For a correct positioning relative to the frame or carrier elements 5 to be supplied from the sides, support elements 15 that are liftable and lowerable in the sense of double arrow 14 are indicated in the region of the coupling elements 4.

To ensure correct positioning, clamping or fixing in the sense of arrows 16, of the individual printed circuit boards 1 can, moreover, be effected when reaching a position proper for connection, the respective positioning or clamping means being known per se.

Conveying elements 18 movable in the sense of double arrow are indicated for supplying the frame or carrier elements 5.

As is particularly apparent from the illustrations according to FIGS. 3 and 4, a connection of the printed circuit boards 1 and the at least one frame or carrier element 5 can be effected not only in a largely automated manner, but also in a horizontal arrangement or positioning such that also the method steps for connecting or assembling the individual elements 1 and 5 can be simplified and optionally accelerated.

In the modified embodiment illustrated in FIGS. 5 and 6, a plurality of printed circuit boards is denoted by 21, which are again designed to have coupling elements 24 on oppositely located edges or side edges 22 and 23. Similarly as in the embodiment of FIGS. 1 and 2, the coupling elements 24 have tapering and, in particular, triangular cross sections, which will subsequently enable simplified centering and fixing to frame or carrier elements 25 designed to have coupling elements in the form of offset regions or depressions 26 to complement the coupling elements 24.

While, in the embodiment according to FIGS. 1 and 2, the coupling elements 4 of the printed circuit boards 1 enter cavities or depressions 6 provided on the side edges of the frame or carrier elements 5 and are substantially completely enclosed by the same, the coupling elements 24 in the embodiment represented in FIGS. 5 and 6 are formed on an upper partial region of the individual printed circuit boards 21, as is clearly apparent from FIG. 6.

In the assembled state as indicated in FIG. 6, the coupling elements 26 of the frame or carrier elements 25 are configured in the form of offset regions or depressions corresponding to the thickness of the coupling elements 24 such that a substantially plane surface will be provided in the region of connection of the coupling elements 24 and 26 in the assembled state.

For the reliable fixation of the coupling elements 24 of the printed circuit boards 21 within the offset depressions 26 provided in the frame or carrier elements 25, it is moreover provided, as schematically indicated in FIGS. 7 and 8, that an adhesive 28 is applied in the region of the coupling site formed by the offset depression 26 via an application device 27 such that a reliable fixation of the coupling elements 24 in the region of the coupling elements 26 will subsequently be achieved.

The automated assemblage of the printed circuit boards 21 with the frame or carrier elements 25 can be performed in the same manner as in the embodiment illustrated in FIGS. 3 and 4, with additional adhesive applying devices having to be provided.

Instead of providing two frame or carrier elements 5 or 25 each on oppositely located edges or side edges 2 and 3 or 22 and 23, respectively, of the printed circuit boards 1 and 21, respectively, it is possible to do with a single frame or carrier element 5 on one side edge 2 or 3, or 22 or 23, respectively, for connection to the plurality of printed circuit boards 1 or 21, respectively.

It will, moreover, do, particularly when providing frame or carrier elements 5 or 25 on oppositely located side edges of the printed circuit boards 1 or 21, to use a single coupling element 4 or 24 on at least one side edge and, accordingly, a single coupling element 6 or 26 on the frame or carrier elements 5 or 25, respectively.

Instead of connecting four printed circuit boards 1 or 21 each with at least one common frame or carrier element 5 or 25, it is, moreover, possible to choose any other number of printed circuit boards 1, particularly as a function of the method steps in subsequent treatment or processing procedures.

It is, furthermore, conceivable that the coupling elements provided on the frame or carrier elements 5 or 25 are formed by coupling elements projecting from side edges of the same and engaging in corresponding complementary depressions or recesses provided on the side edges of the printed circuit boards 1 or 21, respectively, which are fixed in or to the latter.

The invention claimed is:

1. A method for connecting a plurality of printed circuit boards to at least one frame or carrier element, comprising the steps of
providing a plurality of printed circuit boards which are each designed to have at least one coupling element on at least one edge,
providing at least one frame or carrier element for coupling to a plurality of printed circuit boards using coupling elements that in each case complement the at least one coupling element of the printed circuit boards, and
coupling or connecting the printed circuit boards to the at least one frame or carrier element by fitting together the coupling elements of the printed circuit boards and the frame or carrier element,
wherein the at least one frame or carrier element only surrounds or encloses the printed circuit boards over a partial region of the periphery and in that the at least one coupling element of the circuit board is formed by a coupling element having a tapering cross section, and
wherein a plurality of mutually spaced-apart circuit boards on a conveying element are brought into mutual positions provided for a connection to the at least one frame or carrier element, that the at least one frame or carrier element is moved in a supply direction substantially normal to the supply direction of the printed circuit boards towards the printed circuit board edges provided with the coupling elements, and that the coupling elements of the printed circuit boards are coupled or connected to the coupling elements of the frame or carrier element.

2. The method according to claim 1, wherein, after having positioned a plurality of printed circuit boards in a position provided for coupling, two frame or carrier elements are moved in mutually opposite directions towards the printed circuit boards provided with the coupling elements and are connected with the same.

3. The method according to claim 1, wherein the printed circuit boards and/or the frame or carrier elements are positioned and held together by holding or clamping elements.

* * * * *